United States Patent
Iwamoto

[11] Patent Number: 6,069,683
[45] Date of Patent: *May 30, 2000

[54] SCANNING EXPOSURE METHOD AND APPARATUS

[75] Inventor: Kazunori Iwamoto, Utsunomiya, Japan

[73] Assignee: Canon Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/927,280

[22] Filed: Sep. 11, 1997

[30] Foreign Application Priority Data

Sep. 13, 1996 [JP] Japan .................................. 8-263831

[51] Int. Cl.⁷ ........................... G03B 27/42; G03B 27/54
[52] U.S. Cl. ............................................ 355/53; 355/67
[58] Field of Search .................... 355/53, 67, 77, 355/75, 55; 356/399, 400, 401; 250/548

[56] References Cited

U.S. PATENT DOCUMENTS

| | | | |
|---|---|---|---|
| 5,148,214 | 9/1992 | Ohta et al. ................................ | 355/43 |
| 5,194,893 | 3/1993 | Nishi ........................................ | 355/53 |
| 5,281,996 | 1/1994 | Bruning et al. ........................... | 355/77 |
| 5,424,552 | 6/1995 | Tsuji et al. ............................... | 250/548 |
| 5,635,722 | 6/1997 | Wakamoto ............................... | 250/548 |
| 5,654,553 | 8/1997 | Kawakubo et al. ..................... | 250/548 |
| 5,699,145 | 12/1997 | Makinouchi et al. ................... | 355/53 |
| 5,739,899 | 4/1998 | Nishi ........................................ | 355/53 |
| 5,822,043 | 10/1998 | Ebinuma ................................. | 355/55 |
| 5,828,573 | 10/1998 | Hayashi .............................. | 364/468.28 |

*Primary Examiner*—Safet Metjahic
*Assistant Examiner*—Hung Henry Nguyen
*Attorney, Agent, or Firm*—Fitzpatrick, Cella, Harper & Scinto

[57] ABSTRACT

An exposure apparatus includes a projection optical system for projecting a pattern of an original onto a substrate, an original stage for moving the original relative to the projection optical system, a substrate stage for moving the substrate relative to the projection optical system, an alignment detecting system for detecting alignment information related to alignment of at least one of the original and the substrate, a correcting device for correcting the alignment information detected by the alignment detecting system, on the basis of the position of the original stage, and a controller for controlling alignment of at least one of the original and the substrate on the basis of the alignment information as corrected by the correcting device.

13 Claims, 5 Drawing Sheets

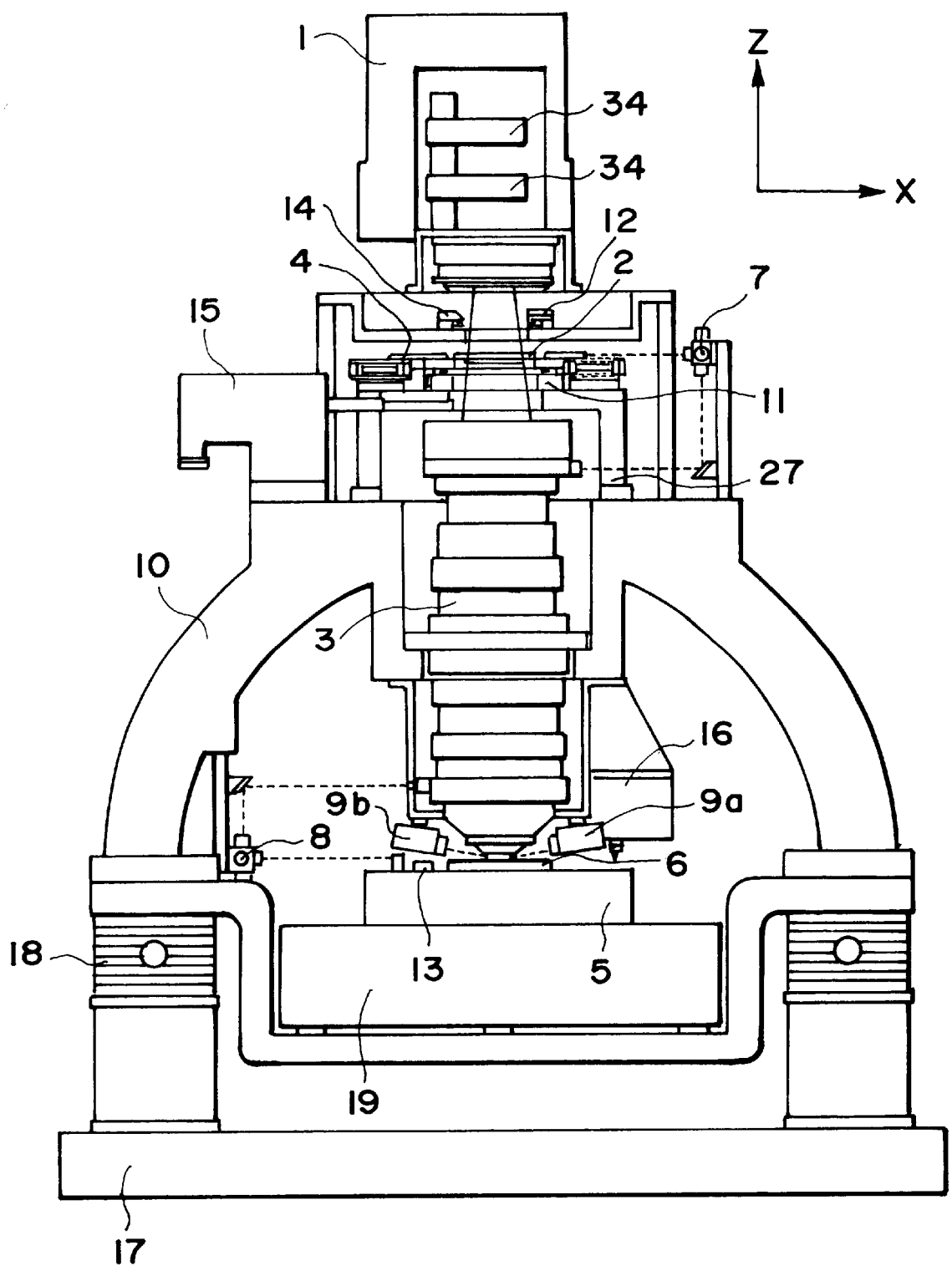
F I G. 1

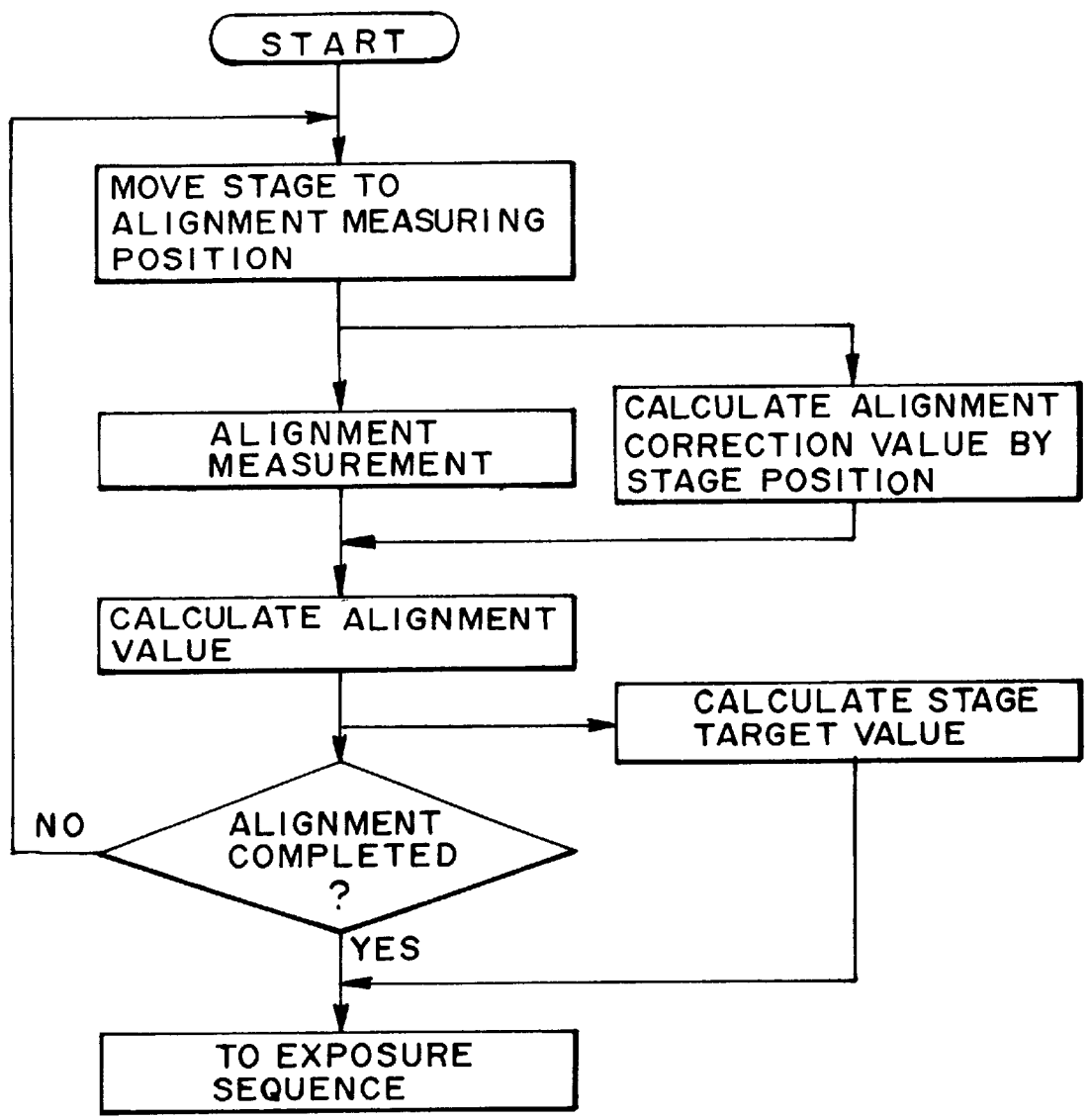
F I G. 3

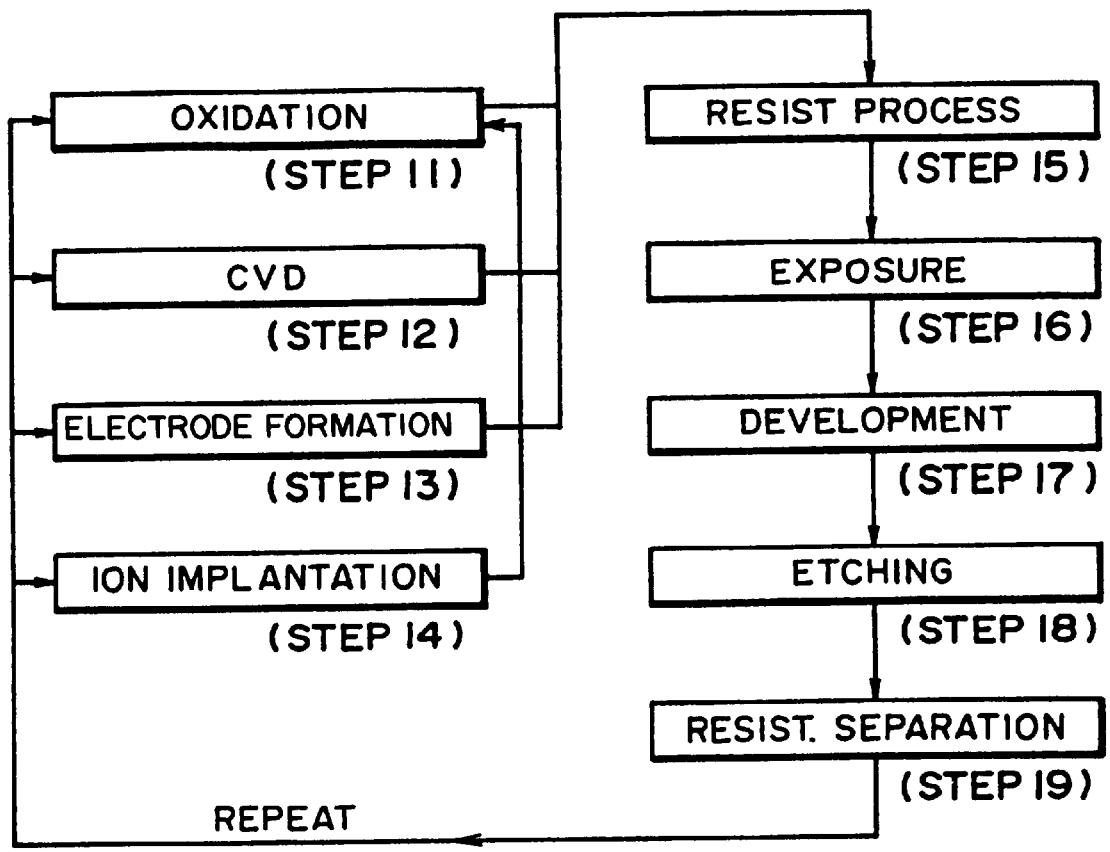
F I G. 5

SCANNING EXPOSURE METHOD AND APPARATUS

FIELD OF THE INVENTION AND RELATED ART

This invention relates to an exposure apparatus usable in the manufacture of semiconductor devices, for printing a design pattern upon a resist material provided on a substrate, and also to a device manufacturing method using such an exposure apparatus.

In an exposure apparatus according to a simultaneous exposure method, if a projection optical system is provided by lenses, the imaging region thereof has a circular shape. However, since a semiconductor integrated circuit is generally of a rectangular shape, the pattern transfer region in the case of the simultaneous exposure method has to be of rectangular shape inscribed within the circular imaging region of the projection optical system. Thus, even the largest pattern transfer region is of a square shape with a side $1/\sqrt{2}$ of the diameter of the circle.

On the other hand, there has been proposed a scan exposure method (step-and-scan method) wherein a slit-like exposure region of a size approximately corresponding to the diameter of a circular imaging region of a projection optical system is used and wherein a reticle and a wafer are scanningly moved in synchronism with each other, whereby the pattern transfer region is enlarged. In this method, with a projection optical system having an imaging region of the same size, a larger pattern transfer region can be attained as compared with the step-and-repeat method wherein for each pattern transfer region the simultaneous exposure is performed by use of a projection lens. More specifically, with respect to the scan direction, there is no limitation by the optical system and, therefore, a pattern transfer region corresponding to the stroke of the stage can be provided. Also, with respect to a direction perpendicular to the scan direction, a pattern transfer region of about $\sqrt{2}$ times larger can be provided.

In exposure apparatuses for the manufacture of semiconductor integrated circuits, enlargement of the pattern transfer region and improvement of the resolution are desired to meet production of larger capacity chips. The capability of using a smaller projection optical system is advantageous with respect to optical performance and cost. Thus, the step-and-scan exposure method is very attractive.

SUMMARY OF THE INVENTION

It is an object of the present invention to provide an improved projection exposure apparatus, more particularly, a projection exposure apparatus of a step-and-scan type, by which performances, more specifically, alignment precision for an original or a substrate, can be improved.

In accordance with an aspect of the present invention, there is provided a scanning exposure apparatus for scanning an original and a substrate so that a pattern of the original is sequentially projected onto the substrate, said apparatus comprising: an illumination optical system for illuminating a predetermined illumination region on the original; a projection optical system for projecting the pattern of the original, in the illumination region, onto the substrate; an original stage for moving the original relative to said projection optical system; a substrate stage for moving the substrate relative to said projection optical system; an alignment system for measuring a positional relation between the original and the substrate; and means for compensating for the measurement through said alignment system in accordance with a position of said original stage.

In one preferred form according to this aspect of the present invention, said compensating means includes determining means for determining a correction value for a detection result of positional deviation, while taking the position of said original stage as a variable.

Examples of such an alignment system may be (i) an off-axis alignment system for measuring the position of the substrate in off-axis, (ii) a non-exposure light TTL alignment system for measuring the position of the substrate through said projection optical system and by use of predetermined non-exposure light; (iii) an exposure light TTR alignment system for measuring a deviation between a first reference mark provided on said original stage and a second reference mark provided on said substrate stage, through said projection optical system and by use of light having a wavelength substantially the same as the exposure light; (iv) an original alignment system for measuring a deviation between a pattern of the original and a third reference mark provided on said original stage, and (v) a focus detecting system for measuring the position of the pattern surface of the substrate.

Said original stage may be supported by an original stage base, and said original stage base and said alignment system may be supported by a projection optical system base for supporting a barrel of said projection optical system.

Each of said off-axis alignment system, said non-exposure light TTL alignment system and said focus detecting system may serve to perform measurement while using a barrel of said projection optical system as a reference.

Said alignment system may detect a positional deviation in a state wherein said original stage is positioned with respect to a predetermined position.

Generally, in projection exposure apparatuses, a barrel base for supporting the barrel of a projection optical system provides a reference of the apparatus, and an alignment system for aligning an original and a substrate is mounted on this barrel base. The inventors of the subject application have found that when an original stage moves the barrel base deforms due to an eccentric load or a reaction force in acceleration and deceleration, that such the deformation applies an adverse effect on the exposure precision of the exposure apparatus such as registration precision or focus precision, of an amount that cannot be disregarded, and that the deformation described above is dependent upon the position of the original stage. The present invention has been made on the basis of these findings.

According to the present invention, in an alignment system for aligning an original and a substrate, an alignment measured value for the original and the substrate may be corrected or compensated for in accordance with the position of the original stage, by which degradation of the alignment measurement precision due to deformation of a barrel base can be prevented or reduced.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 1 is a schematic view of an exposure apparatus according to an embodiment of the present invention.

FIG. 3 is a flow chart for explaining a sequence of alignment measurement in the apparatus of FIG. 1.

FIG. 5 is a flow chart for explaining details of a wafer process, in the procedure of FIG. 4.

DESCRIPTION OF THE PREFERRED EMBODIMENTS

Figure 2:
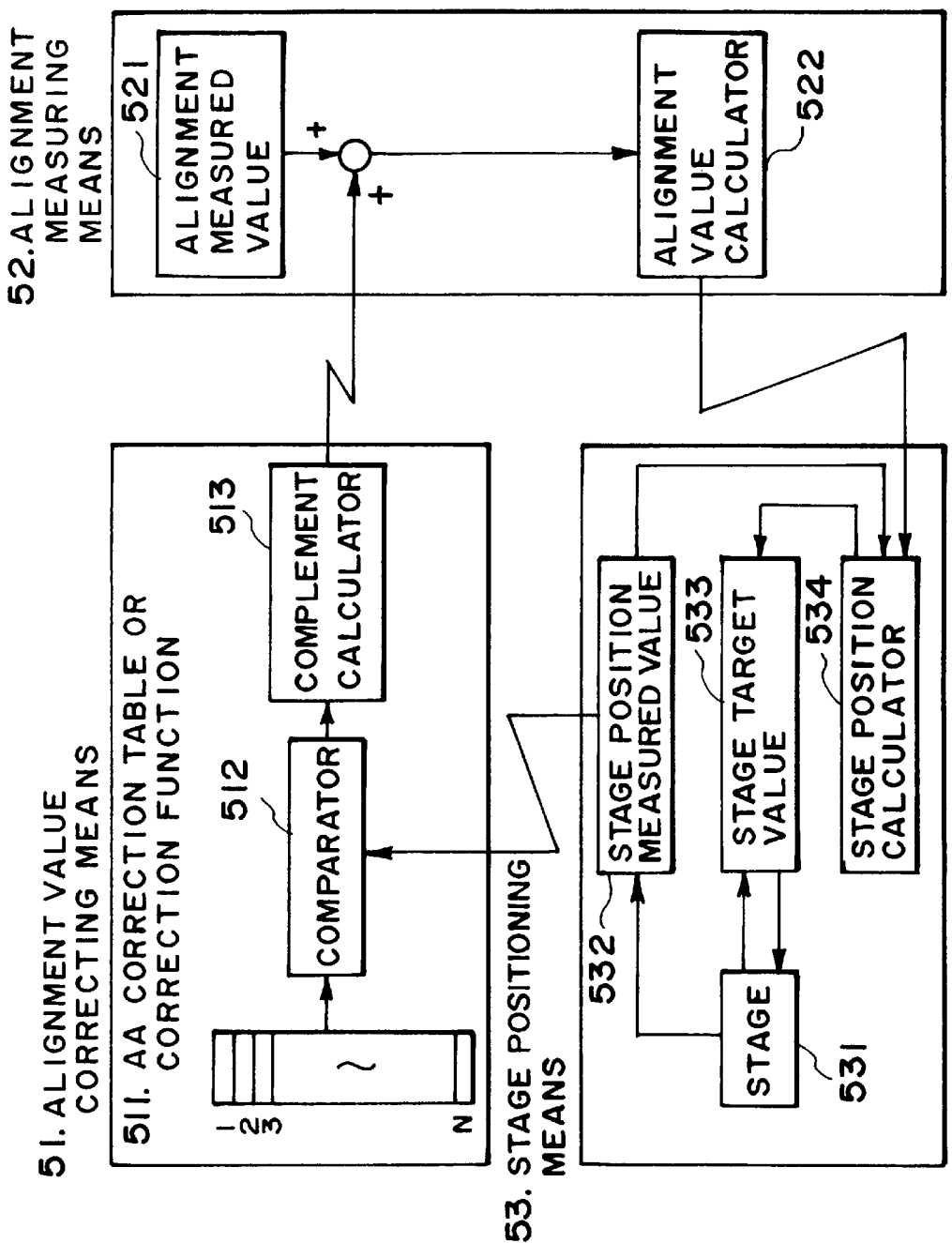
FIG. 2 is a block diagram for explaining the structure of an alignment value correction system in the exposure apparatus of FIG. 1.

A preferred embodiment of the present invention will be described with reference to the drawings. FIG. 1 shows the structure of a scanning exposure apparatus according to an embodiment of the present invention. The exposure apparatus of this embodiment comprises a step-and-scan type exposure apparatus wherein a portion of a pattern of a reticle is projected in a slit shape on to a wafer through a projection optical system, wherein the reticle and the wafer are relatively and scanningly moved in synchronism with each other relative to the projection optical system, whereby the pattern of the reticle is transferred to the wafer, and wherein there is stepwise motion interposed to repeat the scan exposure to plural transfer regions (shots) on the wafer.

In FIG. 1, denoted at 1 is an illumination optical system for illuminating in a slit-like shape a predetermined region on a reticle 2 which is held on a reticle stage 11. In this example, excimer laser light is used for the exposure. However, any other wavelength such as visible light or X-rays may be used in place of it. Denoted at 3 is a projection optical system for projecting a pattern of the reticle 2, in the region as illuminated by the illumination optical system 1, onto a wafer 6 held by a wafer stage 5, in a predetermined reduction magnification.

The reticle stage 11 can be moved in the X direction by a linear motor, not shown. The wafer stage 5 can be moved in the X and Y directions by an X-direction linear motor and a Y-direction linear motor (both not shown). A synchronized scan of the reticle 2 and the wafer 6 is performed by moving the reticle stage 11 and the wafer stage 5 oppositely along the X direction at a predetermined speed ratio (e.g., 4:1). On the wafer stage 5, there is a Z-tilt stage (not shown) on which a wafer chuck (not shown) for holding the wafer is mounted. The wafer stage 5 is mounted on a wafer stage base 19, and the reticle stage 11 is mounted on a reticle stage base 27. The reticle stage base 27 and the projection optical system 3 are mounted on a barrel base 10. The stage base 19 and the barrel base 10 are supported by a base frame 17 at three points through three dampers 18. Each damper 18 comprises an active damper for active vibration control or vibration isolation in six-axis direction. However, it may comprise a passive damper.

Denoted at 7 and 8 are laser interferometers for measuring the positions of the reticle stage 11 and the wafer stage 5, respectively, on the basis of the barrel reference. Measured values of these laser interferometers 7 and 8 are transmitted to a control device (not shown), together with measured values (alignment values) obtained with scopes 12, 14, 15 and 16, to be described later. The control device operates on the basis of these measured values to actuate the reticle stage 11 and the wafer stage 5, to control positioning for stepwise motion or synchronous scan of the reticle 2 and the wafer 6.

Light projecting means 9a and light receiving means 9b provide a focus sensor for detecting whether a wafer 6 on the wafer stage 5 is placed on the focus plane of the projection optical system 3 or not. More specifically, the light projecting means 9a fixed to the barrel base 10 projects light onto the wafer 6 in an oblique direction, and the light receiving means 9b detects the position of reflection light from the wafer to thereby detect the position of the wafer 6 surface with respect to the optical axis direction of the projection optical system 3. The light projecting means 9a has a light emitting element such as an LED, for example, and the light receiving means 9b has a light receiving element such as a CCD sensor.

Denoted at 12 is an exposure light TTR scope with which a first reference plate or the reticle 2 on the reticle stage 11, and a second reference plate 13 or the wafer 6 on the wafer stage 5 can be observed simultaneously through the projection optical system and by use of exposure light (to be used for the exposure process) or light of a wavelength substantially the same as that of the exposure light. First reference plates 4 are fixedly mounted in opposite end portions of the reticle stage 11 with respect to the X direction in the manner that at least one of them comes into the slit-like illumination region of the illumination optical system 1 when the reticle stage 11 reaches a reticle replacement position. The second reference plate 13 is fixedly mounted on the wafer stage 5, at a position not interfering with the wafer 6.

Denoted at 14 is a fine reticle alignment scope for detecting, at the reticle replacement position, a relative positional deviation between the reticle 2 and a reticle reference plate (not shown) fixedly mounted on the reticle stage 11. Denoted at 15 is a non-exposure light TTL scope for measuring a positional deviation of the wafer 6 placed on the wafer stage 5 with respect to a reference provided on the scope 15 itself, through the projection optical system 2 and by use of non-exposure light (light that does not sensitize a resist of the wafer). Along the light path of the non-exposure light TTL scope 15, there are a correction optical system (not shown) for correcting aberration of the projection optical system with respect to exposure light and non-exposure light, and a prism (not shown) for projecting non-exposure light from the scope 15 side onto the projection optical system 3 and for extracting reflected light from the wafer 6 out of the projection optical system 3.

Denoted at 16 is an off-axis scope for measuring a positional deviation of the wafer 6 with respect to a reference provided on the scope 16 itself, the measurement being done outside the view field of the projection optical system 3. Denoted at 34 is a blade stage for scanningly moving a light blocking blade, restricting the illumination light, so as to prevent exposure of any portion other than the shot which is just going to be exposed, during an idle movement period and acceleration and deceleration periods of the reticle stage 11 before and after the scan exposure. The position of this blade stage 34 is monitored continuously by means of an encoder, not shown. At least in periods just before and after a start and end of the scan exposure, it is scanningly moved in synchronism with the reticle stage 11.

In operation with the structure described above, by use of conveying means (not shown), a wafer 6 is conveyed onto the wafer stage 5, from the front portion of the apparatus (in the direction of in the depth as viewed in FIG. 1). After a predetermined alignment operation is completed, the exposure apparatus performs printing of the pattern of the reticle 2 onto plural transfer regions on the wafer 6 while repeating scan exposure and stepwise motion. With regard to the scan exposure, the reticle stage 11 and the wafer stage 5 are moved in the X direction (scan direction) at a predetermined speed ratio so that the pattern of the reticle 2 is scanned with slit-like exposure light, and also the wafer 6 is scanned with the projected image thereof. By this, the pattern of the reticle 2 is transferred and printed onto a particular pattern transfer region on the wafer 6.

During the scan exposure process, the height (level) of the wafer 6 surface is measured by the focus sensor 9 (9a and 9b) described above, and, on the basis of the measured value, the height and tilt of the wafer stage 5 are real-time controlled to execute focus correction. After scan exposure of one transfer region is completed, the wafer stage 5 is driven to move the wafer stepwise in the X and/or Y direction to thereby place another transfer region at the scan exposure start position. Then, the scan exposure is performed. The layout of pattern transfer regions on the wafer, the scan direction (positive or negative direction) and the order of exposures for the transfer regions, for example, are so determined that, with the combination of stepwise motion in the X and Y directions and X-direction movement for scan exposure, the exposures can be done efficiently to plural regions on the wafer.

FIG. 2 is a block diagram of a control system of the apparatus of FIG. 1. In FIG. 2, denoted at 51 is alignment value correcting means, and denoted at 52 is alignment measuring means. Denoted at 53 is stage positioning means. A stage 531 included in the stage positioning means 53 corresponds to the reticle stage 11, wafer stage 5, blade stage 34, and their driving systems of FIG. 1. Stage position measured value 532 corresponds to measured values of the laser interferometers 7 and 8 of FIG. 1 and the encoder described hereinbefore. Alignment measured value 521 in the alignment measuring means 52 corresponds to measured values obtained through the focus sensor 9 of FIG. 1 as well as the scopes 12, 14, 15 and 16.

The alignment value correcting means 51 has stored therein the relationship between the position of the reticle stage 11 and correction values for the measured values of the scopes 12, 14, 15 and 16, in the form of an autoalignment correction value table 511 or of a correction function. Such correction values may be determined beforehand on the basis of errors related to different positions of the reticle stage 11, which errors may be measured beforehand by use of a reference reticle or a reference wafer.

The position of the stage 531 is measured by using the laser interferometers 7 and 8 as well as the encoder, and corresponding measured value 532 is applied to a stage position calculator 534. Further, the measured value of the interferometer 7 is applied also to a comparator 512 included in the alignment value correcting means 51. Comparator 511 reads and takes, in relation to the sensor 9 and each scope, correction values for the position of the reticle stage 11 as represented by the measured value of the interferometer 7 or for a position adjacent to that position. On the basis of these correction values, complement calculator 513 calculates correction values for the sensor and for each scope in the case where the reticle stage 11 is at a current position. Alignment measuring means 52 corrects the measured value 521 of the sensor 9 and each scope, on the basis of the correction values from the complement calculator 513, and the alignment value calculator 522 converts then into alignment values for the stages 11, 5 and 34. These alignment values are applied to stage position calculator 534 of the stage positioning means 53. On the basis of the alignment values and the stage position measured values 532, the stage position calculator 534 calculates positioning target values 533 for the stages, and applies them to the driving system of the stage 531. In accordance with the target values, the driving system of the stage 531 operates to position the stages 11, 5 and 34, respectively.

In this manner, an error in an alignment measured value of the focus sensor 9 or of the scope 12, 14, 15 or 16, attributable to deformation of the barrel base 10 due to an eccentric load of an acceleration or a deceleration reaction force during movement of the reticle stage can be corrected or compensated. Thus, degradation of alignment measurement precision is minimized. On that occasion, preferably the alignment measurement may be made while keeping the stages at fixed positions, by which further enhancement of alignment precision is enabled. For example, the alignment measurement by use of the off-axis scope 16 or the non-exposure light TTL scope 15 may be made as the reticle stage 11 is kept at the reticle replacement position or at the exposure stand-by position for the first shot while the blade stage 34 is kept at the exposure stand-by position for the first shot. The measurement by use of the fine reticle alignment scope 14 may be made as the reticle stage 11 is kept at the reticle replacement position or at the exposure stand-by position for the first shot while the wafer stage and the blade stage 34 are held at the exposure stand-by position for the first shot.

While the foregoing description has been made with reference to cases wherein deformation of the barrel base with movement of the reticle stage 11 and a resultant variation in an alignment value are corrected or compensated, for a similar correction may be made in relation to the movement of the wafer stage 5.

FIG. 3 illustrates an alignment operation for the reticle or wafer, in the apparatus of FIG. 1. For alignment, first the stage on which the subject to be aligned (wafer and/or reticle) is placed is moved to the alignment measurement position. Subsequently, alignment measurement is made by use of an alignment scope. Simultaneously therewith, an alignment correction value which depends on the stage position is calculated. On the basis of the alignment measured value and the alignment correction value, an alignment value is calculated. Subsequently, a discrimination an is made as to whether the alignment has been completed or not. If it is not completed, the above-described procedure for a subsequent alignment measurement position is repeated. In parallel to the alignment completion discrimination, a stage target value is calculated on the basis of the stage position and the alignment value. If the result of the discrimination described above shows completion of alignment, the procedure of exposure sequence starts, and scan the exposure is performed in accordance with the stage target value.

With regard to the measured value of the focus sensor 9 for focus correction during scan exposure or for the measured value for the scan of the blade stage 34, correction of the measured value may be made in a similar manner as described, except that it is to be done during the scan exposure operation.

Next, an embodiment of a microdevice manufacturing method according to an embodiment of the present invention will be described.

Figure 4:
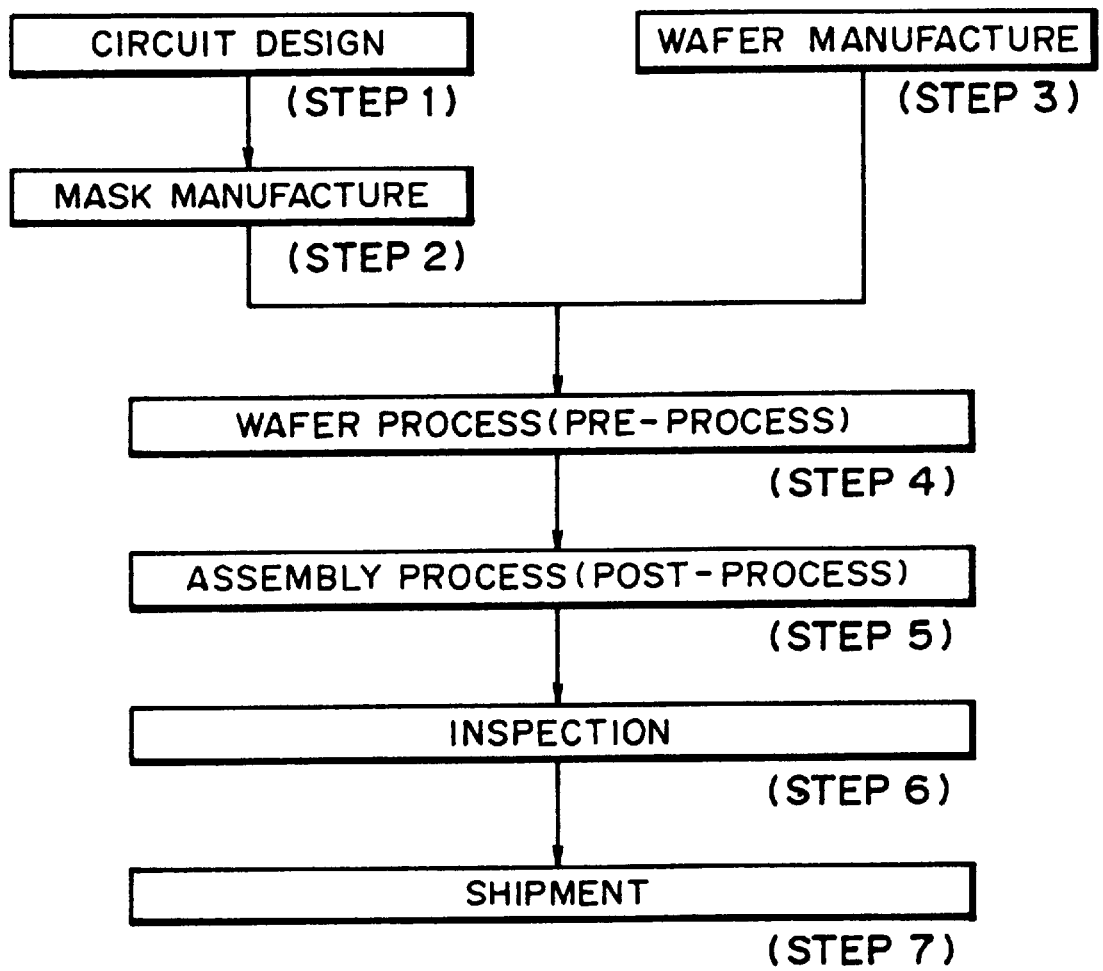
FIG. 4 is a flow chart of microdevice manufacturing processes.

FIG. 4 is a flow chart of a procedure for the manufacture of microdevices such as semiconductor chips (e.g., ICs or LSIs), liquid crystal panels, CCDs, thin film magnetic heads or micro-machines, for example. Step 1 is a design process for designing a circuit of a semiconductor device. Step 2 is a process for making a mask on the basis of the circuit pattern design. Step 3 is a process for preparing a wafer by using a material such as silicon. Step 4 is a wafer process which is called a pre-process wherein, by using the so prepared mask and wafer, circuits are practically formed on the wafer through lithography. Step 5 subsequent to this is an assembling step which is called a post-process wherein the wafer having been processed by step 4 is formed into semiconductor chips. This step includes an assembling (dicing and bonding) process and a packaging (chip sealing) process. Step 6 is an inspection step wherein an operation check, a durability check and so on for the semiconductor devices provided by step 5, are carried out. With these processes, semiconductor devices are completed and they are shipped (step 7).

FIG. 5 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

While the invention has been described with reference to the structures disclosed herein, it is not confined to the details set forth and this application is intended to cover such modifications or changes as may come within the purposes of the improvements or the scope of the following claims.

What is claimed is:

1. An exposure apparatus comprising:
   a projection optical system for projecting a pattern of an original onto a substrate;
   an original stage for moving the original relative to said projection optical system;
   a substrate stage for moving the substrate relative to said projection optical system;
   an alignment detecting system for detecting alignment information related to alignment of at least one of the original and the substrate;
   correcting means for correcting the alignment information detected by said alignment detecting system, on the basis of the position of said original stage; and
   control means for controlling alignment of at least one of the original and the substrate on the basis of the alignment information as corrected by said correcting means.

2. An apparatus according to claim 1, wherein said correcting means comprises determining means for determining a correction value for a detection result of positional deviation, while taking the position of said original stage as a variable.

3. An apparatus according to claim 1, wherein said alignment detecting system detects a positional deviation in a state wherein said original stage is positioned with respect to a predetermined position.

4. An apparatus according to claim 1, wherein said alignment detecting system comprises at least one of (i) an off-axis alignment system for measuring the position of the substrate off-axis, (ii) a non-exposure light TTL alignment system for measuring the position of the substrate through said projection optical system and by use of predetermined non-exposure light; (iii) an exposure light TTR alignment system for measuring a deviation between a first reference mark provided on said original stage and a second reference mark provided on said substrate stage, through said projection optical system and by use of light having a wavelength substantially the same as exposure light; (iv) an original alignment system for measuring a deviation between a pattern of the original and a third reference mark provided on said original stage, and (v) a focus detecting system for measuring the position of the pattern surface of the substrate.

5. An apparatus according to claim 4, wherein each of said off-axis alignment system, said non-exposure light TTL alignment system and said focus detecting system serves to perform measurement while using a barrel of said projection optical system as a reference.

6. An apparatus according to claim 1, further comprising a stage base for supporting said original stage and a barrel base for supporting said projection optical system, wherein said stare base and said alignment detecting system are supported by said barrel base.

7. An apparatus according to claim 1, wherein said apparatus operates in accordance with a step-and-scan sequence to sequentially print the pattern of the original on different regions of the substrate through exposures.

8. An apparatus according to claim 1, wherein said original stage moves the original relative to said projection optical system during an exposure process, and said substrate stage moves the substrate relative to said projection optical system during the exposure process.

9. An exposure method comprising:
   projecting a pattern of an original onto a substrate using a projection optical system;
   moving the original relative to the projection optical system using an original stage;
   moving the substrate relative to the projection optical system using a substrate stage;
   detecting alignment information related to alignment of at least one of the original and the substrate using an alignment detecting system;
   correcting, using correcting means, the alignment information detected by the alignment detecting system, on the basis of the position of the original stage; and
   controlling, using control means, alignment of at least one of the original and the substrate on the basis of the alignment information as corrected in said correcting step.

10. An exposure apparatus, comprising:
    a projection optical system for projecting a pattern of an original onto a substrate;
    an original stage for moving the original relative to said projection optical system;
    a substrate stage for moving the substrate relative to said projection optical system;
    an alignment detecting system for detecting alignment information related to alignment of at least one of the original and the substrate;
    alignment error information generating means for generating alignment error information corresponding to the position of said orignal stage; and
    control means for controlling the movement of at least one of the original and the substrate on the basis of the alignment information and the alignment error information.

11. An exposure apparatus, comprising:
    a projection optical system for projecting a pattern of an original onto a substrate;
    an original stage for moving the original relative to said projection optical system;
    a substrate stage for moving the substrate relative to said projection optical system;

an alignment detecting system for detecting alignment information related to alignment of at least one of the original and the substrate;

alignment error information generating means for generating alignment error information corresponding to the position of said original stage; and control means for controlling the movement of at least one of the original and the substrate on the basis of the alignment error information.

12. An exposure method, comprising the steps of:

projecting a pattern of an original onto a substrate by use of a projection optical system;

moving the original relative to the projection optical system by use of an original stage;

moving the substrate relative to the projection optical system by use of a substrate stage;

detecting alignment information related to alignment of at least one of the original and the substrate, by use of an alignment detecting system;

generating, by use of alignment error information generating means, alignment error information corresponding to the position of said original stage; and controlling, by use of control means, the movement of at least one of the original and the substrate on the basis of the alignment information and the alignment error information.

13. An exposure method, comprising the steps of:

projecting a pattern of an original onto a substrate by use of a projection optical system;

moving the original relative to the projection optical system by use of an original stage;

moving the substrate relative to the projection optical system by use of a substrate stage;

detecting alignment information related to alignment of at least one of the original and the substrate, by use of an alignment detecting system;

generating, by use of alignment error information generating means, alignment error information corresponding to the position of said original stage; and controlling, by use of control means, the movement of at least one of the original and the substrate on the basis of the alignment error information.

* * * * *

UNITED STATES PATENT AND TRADEMARK OFFICE
CERTIFICATE OF CORRECTION

PATENT NO. : 6,069,683
DATED : May 30, 2000
INVENTOR(S) : Kazunori Iwamoto

It is certified that error appears in the above-identified patent and that said Letters Patent is hereby corrected as shown below:

Title Page:
Item [56], Under "References Cited", "U.S. PATENT DOCUMENTS", insert --
5,506,684     4/1996      Ota et al. --.

Column 2:
Line 8, "in" should be deleted:
Line 37, "moves" should read -- moves, --.

Column 3:
Line 14, "on to" should read -- onto;
Line 47, "direction." should read -- directions. --.

Column 6:
Line 21, "compensated, for" should read -- compensated for, --;
Line 32, "an" should be deleted;
Line 40, "of" should read -- of the --; and "the" should be deleted.

Column 8:
Line 15, "stare" should read -- stage --.

Signed and Sealed this

Eighteenth Day of September, 2001

Attest:

*Nicholas P. Godici*

NICHOLAS P. GODICI
*Attesting Officer*    *Acting Director of the United States Patent and Trademark Office*